(12) United States Patent
Matsumura

(10) Patent No.: US 7,523,775 B2
(45) Date of Patent: Apr. 28, 2009

(54) BONDING APPARATUS AND METHOD OF BONDING FOR A SEMICONDUCTOR CHIP

(75) Inventor: Takayoshi Matsumura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/558,195

(22) Filed: Nov. 9, 2006

(65) Prior Publication Data

US 2007/0065985 A1    Mar. 22, 2007

Related U.S. Application Data

(62) Division of application No. 10/991,851, filed on Nov. 19, 2004.

(30) Foreign Application Priority Data

Jul. 1, 2004    (JP)    ............... 2004-195299

(51) Int. Cl.
    *B32B 37/00*    (2006.01)
(52) U.S. Cl. .................. 156/359; 156/64; 156/73.1; 156/580.1
(58) Field of Classification Search ............ 156/64, 156/73.1, 359, 580.1, 580.2; 228/1.1, 4.5, 228/110.1; 700/299, 300, 301
    See application file for complete search history.

(56) References Cited

U.S. PATENT DOCUMENTS

| 5,643,802 | A | 7/1997 | Yamashita |
| 5,843,253 | A * | 12/1998 | Stivani et al. ............... 156/64 |
| 6,793,990 | B1 | 9/2004 | Sakaguchi et al. |
| 2002/0115278 | A1 | 8/2002 | Kawai |
| 2003/0151145 | A1 | 8/2003 | Hesse |

FOREIGN PATENT DOCUMENTS

| JP | 8-153758 | 6/1996 |
| JP | 10-284545 | 10/1998 |
| JP | 11-102933 | 4/1999 |
| JP | 2002-43355 | 2/2002 |
| JP | 2002-271010 | 9/2002 |
| JP | 2003-152018 | 5/2003 |

OTHER PUBLICATIONS

Machine translation of JP08-153758 dated Jun. 11, 1996.*
Machine translation of JP10-284545 dated Oct. 23, 1998.*
Communication from the Japanese Patent Office mailed on Oct. 28, 2008 in the corresponding Japanese patent application.

* cited by examiner

*Primary Examiner*—James Sells
(74) *Attorney, Agent, or Firm*—Staas & Halsey LLP

(57) ABSTRACT

A method of bonding and a bonding apparatus for a semiconductor chip that apply ultrasonic vibration to the semiconductor chip to bond the semiconductor chip to a substrate carry out leveling effectively at low cost and in a short time and can improve the bonding between the semiconductor chip and the substrate. In a positioning step, bumps of the semiconductor chip and pads of the substrate are positioned and placed in contact. In a leveling step, ultrasonic vibration of a first predetermined frequency is applied to the semiconductor chip to make the bumps of the semiconductor chip and the pads of a substrate rub against each other to level the bumps. In a bonding step, ultrasonic vibration of a second predetermined frequency that differs to the first predetermined frequency is applied to the semiconductor chip to bond the bumps and pads of the semiconductor chip and the substrate.

5 Claims, 2 Drawing Sheets

US 7,523,775 B2

BONDING APPARATUS AND METHOD OF BONDING FOR A SEMICONDUCTOR CHIP

CROSS REFERENCE TO RELATED APPLICATION

This application is a Divisional of application Ser. No. 10/991,851 filed Nov. 19, 2004, U.S. Pat. No. 7,432,129, and claims priority to Japanese Patent Application No. 2004-195299 filed Jul. 1, 2004, the entire contents of both of which are incorporated by reference herein.

BACKGROUND OF THE INVENTION

1. Field of the Invention

The present invention relates to a method of bonding a semiconductor chip that bonds bumps and pads of a semiconductor chip and a substrate by bringing bumps or pads of the semiconductor chip into contact with pads or bumps of the substrate and applying ultrasonic vibration to the semiconductor chip, and also to a bonding apparatus that uses this method of bonding.

2. Related Art

In recent years, when manufacturing semiconductor apparatuses such as semiconductor packages, flip-chip bonding to mount a semiconductor chip on a circuit board has been carried out using a method that brings bumps on the semiconductor chip into contact with pads on the circuit board and applies ultrasonic vibration to the semiconductor chip to bond the bumps on the semiconductor chip and the pads on the circuit board.

It should be noted that there are also cases where bumps are provided on the circuit board and pads are provided on the semiconductor chip.

According to this method of bonding, the bumps and pads are strongly rubbed against each other by the ultrasonic vibration, which causes an alloying reaction to take place between the metal forming the bumps and the metal forming the pads and so results in the bumps and pads being bonded together.

It should be noted that as the combination of materials for the pads and bumps, it is normal to use gold (Au) as the bumps and aluminum (Al) as the pads.

In many cases, the bumps (gold bumps) of the semiconductor chip are formed as so-called "stud bumps". Stud bumps are formed by first bonding wires to the terminals of the semiconductor chip on which the bumps are to be formed and then breaking off the wires close to the base parts.

In particular, when such stud bumps are bonded to pads using ultrasonic vibration, since the stud bumps are formed in non-uniform and pointed shapes, the stress produced between the bumps and pads tends to be uneven. For this reason, the alloying reaction between the bumps and pads also becomes uneven and so-called "Kirkendall voids" are produced between the bumps and pads, which worsen the bonding and in turn can easily cause a semiconductor apparatus to be defective.

To avoid this problem, before the bumps and pads are bonded together, a technique that levels the bumps to make the shapes of the bumps more even has been conventionally used.

A conventional method of leveling is disclosed in Patent Document 1. A leveling tool with a flat contact surface that contacts all of the stud bumps of a semiconductor chip is placed in contact with the stud bumps and pressed to flatten the tips of the stud bumps, thereby making the shapes of the bumps even (see Patent Document 1, Paragraphs 0009 and 0051, and FIGS. 4, 16, and 18 to 20).

Patent Document 1
Japanese Laid-Open Patent Publication No. 2002-299362 (Paragraphs 0009 and 0051, and FIGS. 4, 16, and 18 to 20)

However, the leveling carried out in a conventional method of bonding a semiconductor chip requires a process that presses a leveling tool onto the bumps of the semiconductor chip, resulting in the problem of the cost and time required when carrying out this process.

Also, although it is desirable to form the bumps in a smooth shape by leveling, if a flat contact surface of a leveling tool is pressed onto the bumps, sharp corners will be formed at the edges of end surfaces of the flattened bumps, so that when the bumps and pads are ultrasonically bonded together, stress will be concentrated at such edges, resulting in insufficient stress in the central parts and, in some cases, problems relating to poor bonding, such as the creation of Kirkendall voids in the central parts of the end surfaces of the bumps.

SUMMARY OF THE INVENTION

The present invention was conceived in order to solve the above problem, and it is an object of the present invention to provide a method of bonding for a semiconductor chip and a bonding apparatus that uses the same, the method applying ultrasonic vibration to a semiconductor chip to bond the semiconductor chip and a substrate and being capable of carrying out leveling effectively at low cost and in a short time and of improving the bond between the semiconductor chip and the substrate.

To achieve the stated object, the present inventor realized the present invention from the idea that large reductions can be made in the time taken to transfer from the leveling process to the bonding process and in the time taken by the bonding process by carrying out leveling using ultrasonic vibration of a different frequency to the ultrasonic vibration used during bonding of the semiconductor chip.

To achieve the stated object, a method of bonding a semiconductor chip according to the present invention includes: a positioning step of positioning and placing in contact bumps or pads of a semiconductor chip and pads or bumps of a substrate; a leveling step of applying ultrasonic vibration of a first predetermined frequency to the semiconductor chip to make the bumps or pads of the semiconductor chip and the pads or bumps of a substrate rub against each other to level the bumps; and a bonding step of applying ultrasonic vibration of a second predetermined frequency that differs to the first predetermined frequency to the semiconductor chip to bond the bumps and the pads of the semiconductor chip and the substrate.

In addition, the first predetermined frequency may be a lower frequency than the second predetermined frequency.

By doing so, the bumps can be favorably leveled to a smooth shape by ultrasonic vibration of the first predetermined frequency that is lower than the second predetermined frequency used to bond the bumps and pads.

In the leveling step and the bonding step, a contact body, which is connected to an ultrasonic vibrator capable of vibrating at the first and second predetermined frequencies, may be placed in contact with the semiconductor chip and by ultrasonically vibrating the contact body using the ultrasonic vibrator, ultrasonic vibrations of the first and second predetermined frequencies may be applied to the semiconductor chip from the ultrasonic vibrator via the contact body.

By doing so, in the leveling step and the bonding step, it is possible to apply the ultrasonic vibration of the first and second predetermined frequencies consecutively with the same contact body in contact with the semiconductor chip.

In the leveling step, ultrasonic vibrations of a plurality of different frequencies may be applied to the semiconductor chip as the ultrasonic vibration of the first predetermined frequency.

In addition, in the leveling step, the ultrasonic vibrations of the plurality of different frequencies may be applied to the semiconductor chip in ascending order of frequency.

By applying a plurality of different frequencies to the semiconductor chip in this way, it is possible to carry out leveling more effectively.

Also, in the bonding step, ultrasonic vibrations of a plurality of different frequencies may be applied to the semiconductor chip as the ultrasonic vibration of the second predetermined frequency.

In addition, in the bonding step, the ultrasonic vibrations of the plurality of different frequencies may be applied to the semiconductor chip in ascending order of frequency.

By applying a plurality of different frequencies to the semiconductor chip in this way, the bumps and pads can be bonded together more strongly.

To achieve the stated object, a bonding apparatus for a semiconductor chip according to the present invention uses any of the methods of bonding a semiconductor chip disclosed and includes: a contact body capable of connecting to the semiconductor chip that is positioned with respect to the substrate by the positioning step; and an ultrasonic vibrator that is provided so as to be capable of vibrating at the first and second predetermined frequencies, is connected to the contact body, and applies ultrasonic vibration of the first and second predetermined frequencies to the semiconductor chip via the contact body.

The bonding apparatus for a semiconductor chip may further include a control unit for controlling the ultrasonic vibrator so that after the leveling step has been carried out by applying ultrasonic vibration of the first predetermined frequency to the semiconductor chip, the bonding step is carried out by applying ultrasonic vibration of the second predetermined frequency to the semiconductor chip.

The ultrasonic vibrator may include a first ultrasonic vibrator that is capable of vibrating at the first predetermined frequency and a second ultrasonic vibrator that is capable of vibrating at the second predetermined frequency, the first ultrasonic vibrator and the second ultrasonic vibrator contacting the contact body.

With this construction, in the leveling step and in the bonding step, the ultrasonic vibrations of the first and second frequencies can be consecutively applied with the same contact body in contact with the semiconductor chip.

In addition, ultrasonic vibrations of a plurality of different frequencies may be applied to the semiconductor chip as the ultrasonic vibration of the first predetermined frequency and the bonding apparatus may include a plurality of first ultrasonic vibrators that are capable of vibrating at respectively different first predetermined frequencies.

With this construction, by applying a plurality of different frequencies to the semiconductor chip, leveling can be carried out more effectively.

Ultrasonic vibrations of a plurality of different frequencies may be applied to the semiconductor chip as the ultrasonic vibration of the second predetermined frequency and the bonding apparatus may include a plurality of second ultrasonic vibrators that are capable of vibrating at respectively different second predetermined frequencies.

With this construction, by applying a plurality of different frequencies to the semiconductor chip, stronger bonding can be achieved.

In addition, lengths of the contact body in respective wave directions of the ultrasonic vibration applied by the single ultrasonic vibrator or plurality of ultrasonic vibrators may be set as natural number multiples of respective wavelengths of the ultrasonic vibrations.

With this construction, the contact body will favorably resonate with the ultrasonic vibrations of the first and second predetermined frequencies, so that the ultrasonic vibrations can be applied to the semiconductor chip with high efficiency.

According to the method of bonding and bonding apparatus for a semiconductor chip according to the present invention, the leveling step and the bonding step can be carried out by applying ultrasonic vibrations of the first and second predetermined frequencies, so that a large reduction can be made in the time taken to transfer from the leveling step to the bonding step. In addition, the application of the ultrasonic vibration of the first predetermined frequency during the leveling step achieves a weak, provisional bonding of the bumps and pads, so that the application period of the second predetermined frequency during the bonding step can be shortened.

In addition, the leveling step of the present invention levels the bumps by rubbing the bumps and pads against each other using ultrasonic vibration, so that unlike a conventional leveling step, the bumps can be made smooth without producing corners on the bumps. As a result, during the bonding step, local insufficiencies in stress can be avoided, so that bonding problems such as Kirkendall voids can be largely prevented.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings.

DESCRIPTION OF THE PREFERRED EMBODIMENTS

Preferred embodiments of a method of bonding and a bonding apparatus for a semiconductor chip according to the present invention will now be described with reference to the attached drawings.

First Embodiment

Figure 1:
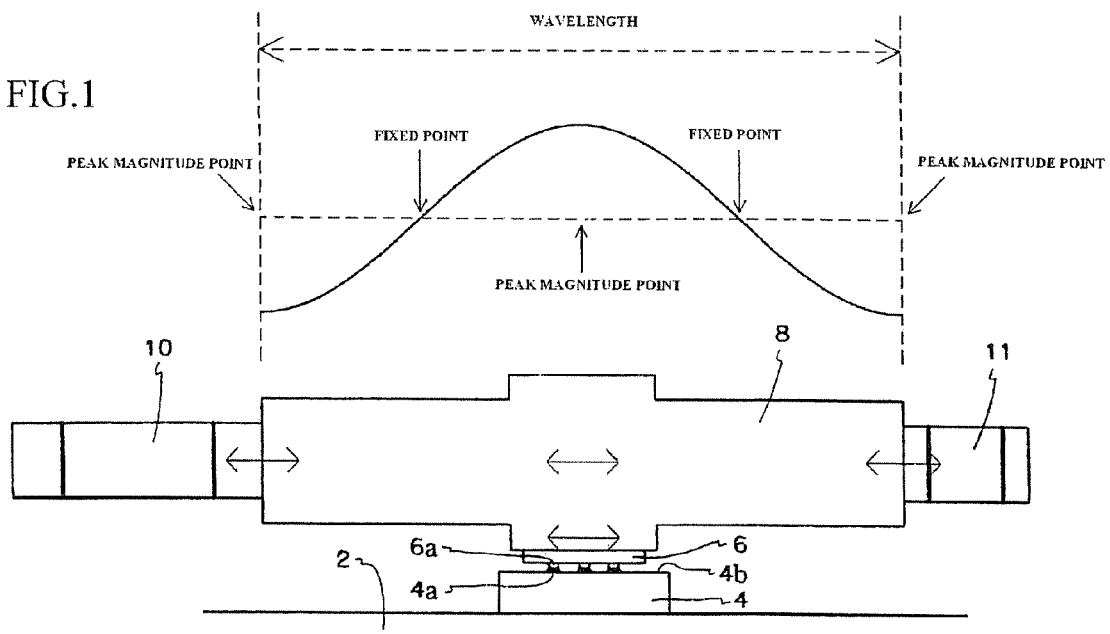
FIG. 1 is a diagram useful in explaining a bonding apparatus for a semiconductor chip according to a first embodiment of the present invention, and a leveling step of a method of bonding used by the bonding apparatus.
Figure 2:
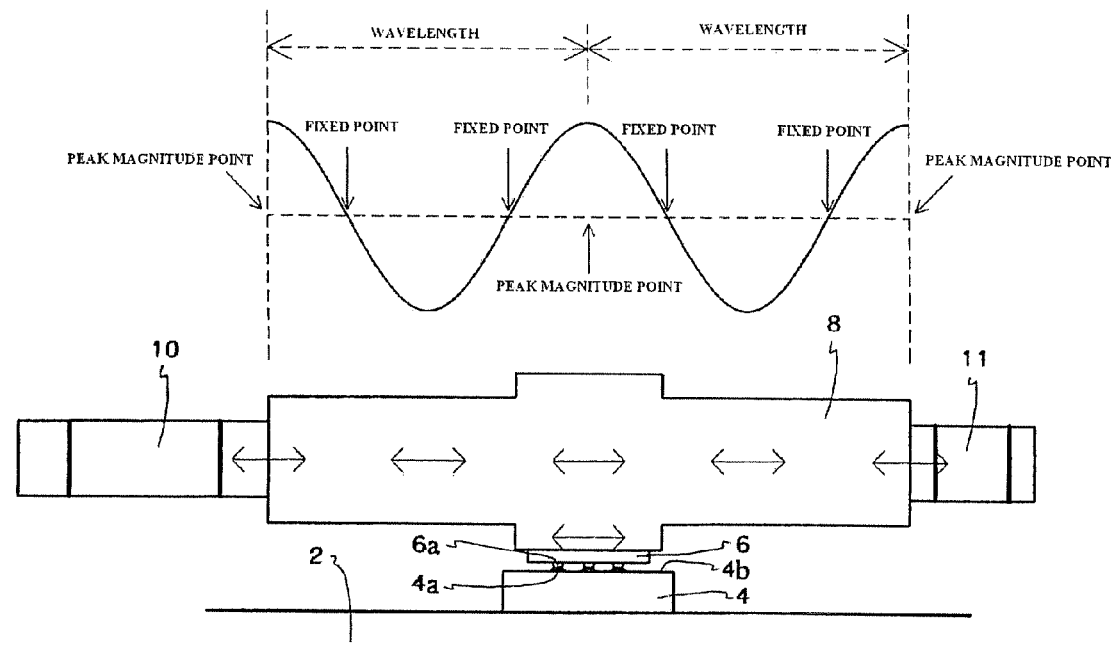
FIG. 2 is a diagram useful in explaining a bonding apparatus for a semiconductor chip according to the first embodiment of the present invention, and a bonding step of the method of bonding used by the bonding apparatus.

In FIGS. 1 and 2, a circuit board 4 with pads $4a$, $4a$, . . . provided on a mounting surface $4b$ (on which a semiconductor chip 6 will be mounted) so as to correspond to bumps $6a$, $6a$, . . . of the semiconductor chip 6 is held on a stage 2.

The semiconductor chip 6 is positioned by a positioning step so that the bumps $6a$, $6a$, . . . that serve as electrode terminals respectively contact the pads $4a$, $4a$, . . . of the circuit board 4.

The bumps 6a of the semiconductor chip 6 are not subject to any particular limitations, but in the present embodiment are gold (Au) stud bumps formed by first bonding wires to terminals of the semiconductor chip 6 on which the bumps 6a are to be formed and then breaking off the wires close to the base parts.

The pads 4a of the circuit board 4 are aluminum (Al) pads.

In a leveling step (see FIG. 1) and a bonding step (see FIG. 2) described later, a contact body 8 contacts an opposite surface of the semiconductor chip 6 to the surface on which the bumps 6a are formed and applies a slight load onto the semiconductor chip 6 toward the circuit board 4.

A bonding apparatus for a semiconductor chip that uses the method of bonding a semiconductor chip according to this first embodiment will now be described.

The end surfaces of the contact body 8 are respectively connected to a first ultrasonic vibrator 10 used in the leveling process and a second ultrasonic vibrator 11 used in the bonding step, and the contact body 8 and the semiconductor chip 6 are ultrasonically vibrated by ultrasonically vibrating the first or second first ultrasonic vibrator 10, 11 in the horizontal direction with a vibration control apparatus (not shown) as a control means.

Although there are no particular limitations, in this first embodiment, the bonding apparatus is constructed so that the first ultrasonic vibrator 10 vibrates at 25 kHz (a first predetermined frequency) and the second ultrasonic vibrator 11 vibrates at 50 kHz (a second predetermined frequency).

The lengths in the wave direction (the left-right direction in FIG. 1) of the ultrasonic vibrations applied to the first and second ultrasonic vibrators 10, 11 are respectively set at lengths given by natural number multiples of the wavelength of the ultrasonic vibration of the first predetermined frequency (25 kHz) and the wavelength of the ultrasonic vibration of the second predetermined frequency (50 kHz) respectively transmitted to the contact body 8. It should be noted that the wavelength λ of the ultrasonic vibration (compressional waves) transmitted to the contact body 8 is given by λ=V/f where f is the frequency and V is the velocity of the compressional waves. Here, since V is a constant that is unique to the material of the contact body 8, the wavelength of the ultrasonic vibration is universally determined by the frequency.

In this first embodiment, the length of the contact body 8 is set so as to be equal (1×) to the wavelength of the ultrasonic vibration at the first predetermined frequency (25 kHz) and double (×2) the wavelength of the ultrasonic vibration at the second predetermined frequency (50 kHz).

The semiconductor chip 6 is constructed so as to be contacted by the contact body 8 at a position that is exactly midway between the first ultrasonic vibrator 10 and the second ultrasonic vibrator 11.

Next, the method of bonding a semiconductor chip according to the present invention will be described in order of the procedure used by the method.

Positioning Step

First the semiconductor chip 6 is positioned so that the bumps 6a, 6a, . . . used as the electrode terminals contact the pads 4a, 4a, . . . of the circuit board 4.

Leveling Step

Next, the opposite surface of the semiconductor chip 6 to the surface on which the bumps 6a are formed (i.e., the upper surface) is placed in contact with the contact body 8 and a slight load is applied to the semiconductor chip 6 toward the circuit board 4. In this state, the first ultrasonic vibrator is ultrasonically vibrated (see FIG. 1) by the vibration control apparatus in the horizontal direction at a frequency of 25 kHz (the first predetermined frequency).

By doing so, the ultrasonic vibration is transmitted to the contact body 8 as compressional waves. These compressional waves inevitably have maximum amplitude points (points where the amount of displacement in the compressional wave direction is greatest) at both ends of the contact body 8 that are connected to the ultrasonic vibrators 10, 11. Since the length of the contact body 8 is set so as to be equal to (1×) the wavelength for the first predetermined frequency, a maximum amplitude point is located in a central part of the contact body 8 so that ultrasonic vibration of the first predetermined frequency is applied with high efficiency to the semiconductor chip 6 in contact with the central part of the contact body 8.

By having the semiconductor chip 6 ultrasonically vibrate at 25 kHz, the bumps 6a of the semiconductor chip 6 and the pads 4a of the circuit board 4 are made to rub against each other so that the pointed parts of the bumps (stud bumps) 6a are leveled to become smooth.

Bonding Step

Next, the vibration control apparatus stops the driving of the first ultrasonic vibrator 10 and has the second ultrasonic vibrator 11 ultrasonically vibrate (see FIG. 2) in the horizontal direction at 50 kHz (the second predetermined frequency).

By doing so, the ultrasonic vibration is transmitted to the contact body 8 as compressional waves. The compressional waves inevitably have maximum amplitude points (points where the amount of displacement in the compressional wave direction is greatest) at both ends of the contact body 8 that are connected to the ultrasonic vibrators 10, 11. Since the length of the contact body 8 is set so as to be double (2×) the wavelength for the second predetermined frequency, a maximum amplitude point is located in a central part of the contact body 8 so that ultrasonic vibration of the second predetermined frequency is applied with high efficiency to the semiconductor chip 6 in contact with the central part of the contact body 8.

By having the semiconductor chip 6 ultrasonically vibrate at a high frequency of 50 kHz, the bumps 6a of the semiconductor chip 6 and the pads 4a of the circuit board 4 are made to rub against each other so that an alloying reaction occurs between the metal (Au) forming the bumps 6a and the metal (Al) forming the pads 4a, thereby bonding the bumps 6a and the pads 4a together.

According to the method of bonding and bonding apparatus for a semiconductor chip according to the first embodiment, by merely having the ultrasonic vibrators 10, 11 switchably vibrate using the vibration control apparatus, it is possible to carry out the leveling step and the bonding step consecutively, so that a large reduction can be made in the time taken to transfer from the leveling step to the bonding step.

Also, by applying an ultrasonic signal of the first predetermined frequency during the leveling step, a weak, provisional bonding of the bumps and pads is achieved, so that the application period of the second predetermined frequency during the bonding step can be shortened.

In addition, during the leveling step of the first embodiment, the bumps 6a are leveled by being rubbed against the pads 4a by ultrasonic vibration, so that unlike the conventional leveling step, it is possible to carry out leveling without producing any corners and so make the bumps 6a smooth, so that localized insufficiencies in stress can be avoided in the bonding step and bonding problems such as Kirkendall voids can be largely prevented.

It should be noted that in the first embodiment, a construction where separate first and second ultrasonic vibrators are driven to apply ultrasonic vibration of the first and the second predetermined frequency is used, but it is also possible to use a construction where vibration control is switched so that a single ultrasonic vibrator is caused to vibrate at first and second predetermined frequencies (for example, 25 kHz and 50 kHz).

Second Embodiment

A method of bonding and a bonding apparatus for a semiconductor chip according to a second embodiment of the present invention will now be described. It should be noted that parts that are the same as in the first embodiment will not be described.

In this second embodiment, in addition to the construction of the first embodiment, ultrasonic vibrations of a plurality of different frequencies are applied to the semiconductor chip 6 in the leveling step and in the bonding step.

Figure 3:
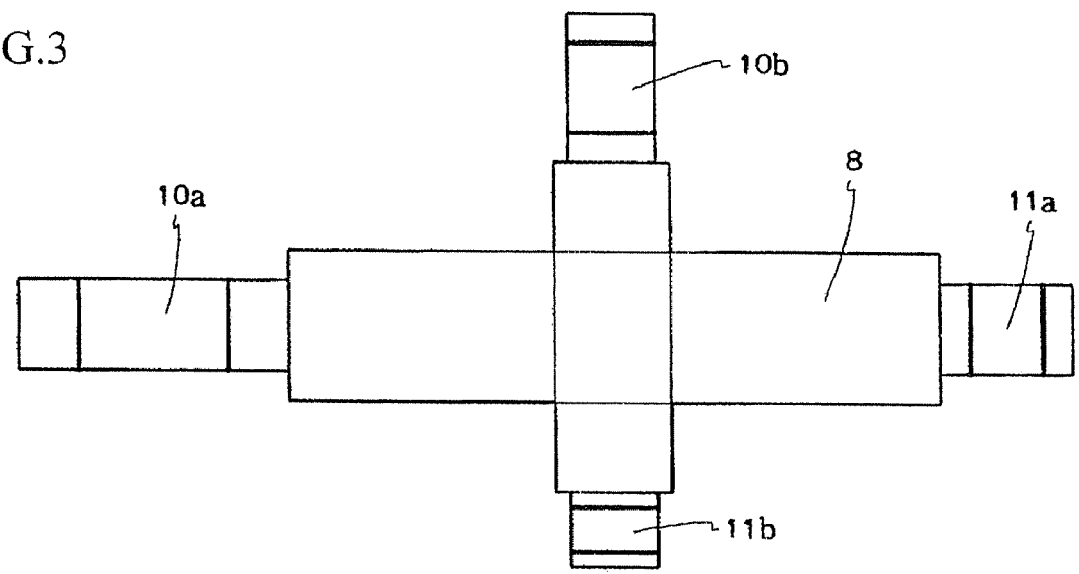
FIG. 3 is a diagram showing a bonding apparatus for a semiconductor chip that uses a method of bonding a semiconductor chip according to a second embodiment of the present invention.

A bonding apparatus for a semiconductor chip that uses the method of bonding a semiconductor chip according to this second embodiment is shown in FIG. 3. It should be noted that although FIGS. 1 and 2 of the first embodiment are front elevations of an apparatus, FIG. 3 is a plan view showing the apparatus from above.

The contact body 8 of the bonding apparatus for a semiconductor chip shown in FIG. 3 is connected to a plurality of first ultrasonic vibrators 10a, 10b that are used in the leveling step and to a plurality of second ultrasonic vibrators 11a, 11b that are used in the bonding step, and the contact body 8 and the semiconductor chip 6 are ultrasonically vibrated by ultrasonically vibrating the first or second first ultrasonic vibrators 10a, 10b, 11a, 11b in the horizontal direction using a vibration control apparatus (not shown).

Although there are no particular limitations, in this second embodiment, the bonding apparatus is constructed so that the first ultrasonic vibrator 10a vibrates at 20 kHz, the first ultrasonic vibrator 10b vibrates at 30 kHz, the second ultrasonic vibrator 11a vibrates at 40 kHz, and the second ultrasonic vibrator 11b vibrates at 60 kHz.

The length of the contact body 8 in the wave direction (the left-right direction in FIG. 1) of the ultrasonic vibrations applied by the first and second ultrasonic vibrators 10a, 11a is set at a length given by natural number multiples of the wavelength of the ultrasonic vibration of a first predetermined frequency (20 kHz) of the first ultrasonic vibrator 10a and of the wavelength of the ultrasonic vibration of the second predetermined frequency (40 kHz) of the second ultrasonic vibrator 11a respectively transmitted to the contact body 8.

In this second embodiment, the length of the contact body 8 in the left-right direction is set so as to be equal (1×) to the wavelength of the ultrasonic vibration at the first predetermined frequency (20 kHz) of the first ultrasonic vibrator 10a and double (×2) the wavelength of the ultrasonic vibration at the second predetermined frequency (40 kHz) of the second ultrasonic vibrator 11a.

In the same way, the length of the contact body 8 in the wave direction (the up-down direction in FIG. 3) of the ultrasonic vibration applied by the first and second ultrasonic vibrators 10a, 11a is set at a length given by natural number multiples of the wavelength of the ultrasonic vibration at the first predetermined frequency (30 kHz) of the first ultrasonic vibrator 10b and of the wavelength of the ultrasonic vibration at the second predetermined frequency (60 kHz) of the second ultrasonic vibrator 11b. In this second embodiment, the length of the contact body 8 in the up-down direction in FIG. 3 is set equal (1×) to the wavelength of the ultrasonic vibration at the first predetermined frequency (30 kHz) of the first ultrasonic vibrator 10b and double (2×) the wavelength of the ultrasonic vibration at the second predetermined frequency (60 kHz) of the second ultrasonic vibrator 11b.

In the leveling step of this second embodiment, first the first ultrasonic vibrator 10a is vibrated to carry out leveling and then the driving of the first ultrasonic vibrator 10a is stopped and the first ultrasonic vibrator 10b is vibrated to level and make the bumps 6a even smoother.

Next, in the bonding step, first the second ultrasonic vibrator 11a is vibrated to provisionally bond the bumps 6a and the pads 4a, and then the driving of the second ultrasonic vibrator 11a is stopped and the second ultrasonic vibrator 11b is vibrated to bond the bumps 6a and the pads 4a.

According to the method of bonding and bonding apparatus for a semiconductor chip according to the second embodiment, by applying a plurality of different frequencies to a semiconductor chip, it is possible to carry out leveling more effectively.

In addition, by applying a plurality of different frequencies to a semiconductor chip, it is possible to carry out stronger bonding.

In the above embodiments, an example where pads are provided on the substrate and bumps are provided on the semiconductor chip has been described, but the present invention can also be applied to bonding a semiconductor chip in the case where bumps are provided on the substrate and pads are provided on the semiconductor chip.

Also, although the case where a semiconductor chip and a circuit board are bonded has been described in the above embodiments, the method of bonding and bonding apparatus for a semiconductor chip according to the present invention are not limited to this and can be applied to all kinds of fields where semiconductor chips are bonded using ultrasonic vibration. For example, in recent years, research is being conducted into techniques that bond semiconductor chips together via bumps or pads, and the present invention, which levels bumps by applying ultrasonic vibration to the semiconductor chips, can also be applied in this case.

In addition, the present invention can also be applied in other cases such as when external connection terminals (bumps) of a semiconductor chip are bonded to a printed circuit board using ultrasonic vibration.

What is claimed is:

1. A bonding apparatus for a semiconductor chip using a method of bonding a semiconductor chip, the method comprising:
  positioning and placing in contact bumps or pads of a semiconductor chip and pads or bumps of a substrate;
  applying ultrasonic vibration of a first predetermined frequency to the semiconductor chip to make the bumps or pads of the semiconductor chip and the pads or bumps of a substrate rub against each other to level the bumps; and
  applying ultrasonic vibration of a second predetermined frequency that differs to the first predetermined frequency to the semiconductor chip to bond the bumps and the pads of the semiconductor chip and the substrate, and the apparatus comprising:
  a contact body capable of connecting to the semiconductor chip, at a contact point provided along a longitudinal center of the contact body, that is positioned with respect to the substrate by the positioning step;
  an ultrasonic vibrator configured to vibrate at the first and second predetermined frequencies that is connected to the contact body and applies ultrasonic vibration of the first and second predetermined frequencies to the semiconductor chip via the contact body, the ultrasonic vibrator including a first ultrasonic vibrator provided at a first end surface of the contact body and a second ultrasonic vibrator provided at a second end surface of the contact body; and control means for controlling the first ultrasonic vibrator and the second ultrasonic vibrator such that the first ultrasonic vibrator vibrates at the first predetermined frequency to level the bumps and the second ultrasonic vibrator vibrates at the second predetermined frequency to bond the bumps, the first predetermined frequency being a lower frequency than the second predetermined frequency.

2. A bonding apparatus according to claim 1, wherein a length of the contact body in the wave direction of the ultrasonic vibration of the first predetermined frequency applied by the first ultrasonic vibrator is set as a natural number multiple of the wavelength of the ultrasonic vibration of the first predetermined frequency, and a length of the contact body in the wave direction of the ultrasonic vibration of the second predetermined frequency applied by the second ultrasonic vibrator is set as a natural number multiple of the wavelength of the ultrasonic vibration of the second predetermined frequency.

3. A bonding apparatus according to claim 2, wherein the length of the contact body in the wave direction of the ultrasonic vibration of the first predetermined frequency applied by the first ultrasonic vibrator is equal to the wavelength of the ultrasonic vibration of the first predetermined frequency and double the wavelength of the ultrasonic vibration of the second predetermined frequency.

4. A bonding apparatus for a semiconductor chip using a method of bonding a semiconductor chip, the method comprising:

positioning and placing in contact bumps or pads of a semiconductor chip and pads or bumps of a substrate;

applying ultrasonic vibrations of a first predetermined frequency and a third predetermined frequency to the semiconductor chip to make the bumps or pads of the semiconductor chip and the pads or bumps of a substrate rub against each other to level the bumps; and applying ultrasonic vibration of a second predetermined frequency and a fourth predetermined frequency that differ from the first predetermined frequency and the third predetermined frequency, respectively, to the semiconductor chip to bond the bumps and the pads of the semiconductor chip and the substrate, and the apparatus comprising:

a contact body capable of connecting to the semiconductor chip, at a contact point provided along a longitudinal center of the contact body, that is positioned with respect to the substrate by the positioning step, the contact body having a cross-like shape in which a first contact part and a second contact part intersect in a common plane with the contact point being provided at the intersection;

an ultrasonic vibrator configured to vibrate at the first, second, third, and fourth predetermined frequencies that is connected to the contact body and applies ultrasonic vibration of the first, second, third, and fourth predetermined frequencies to the semiconductor chip via the contact body, the ultrasonic vibrator including a first ultrasonic vibrator provided at a first end surface of the first contact part, a second ultrasonic vibrator provided at a second end surface of the first contact part, a third ultrasonic vibrator provided at a first end surface of the second contact part, and a fourth ultrasonic vibrator provided at a second end surface of the second contact part; and control means for controlling the first ultrasonic vibrator, the second ultrasonic vibrator, the third ultrasonic vibrator, and the fourth ultrasonic vibrator such that the first ultrasonic vibrator and the third ultrasonic vibrator vibrate at the first predetermined frequency and the third predetermined frequency, respectively, to level the bumps and the second ultrasonic vibrator and the fourth ultrasonic vibrator vibrate at the second predetermined frequency and the fourth predetermined frequency, respectively, to bond the bumps, the first predetermined frequency being a lower frequency than the second predetermined frequency and the third predetermined frequency being a lower frequency than the fourth predetermined frequency.

5. A bonding apparatus according to claim 4, wherein a length of the first contact part in the wave direction of the ultrasonic vibration of the first predetermined frequency applied by the first ultrasonic vibrator is set as a natural number multiple of the wavelength of the ultrasonic vibration of the first predetermined frequency, a length of the first contact part in the wave direction of the ultrasonic vibration of the second predetermined frequency applied by the second ultrasonic vibrator is set as a natural number multiple of the wavelength of the ultrasonic vibration of the second predetermined frequency, a length of the second contact part in the wave direction of the ultrasonic vibration of the third predetermined frequency applied by the third ultrasonic vibrator is set as a natural number multiple of the wavelength of the ultrasonic vibration of the third predetermined frequency, and a length of the second contact part in the wave direction of the ultrasonic vibration of the fourth predetermined frequency applied by the fourth ultrasonic vibrator is set as a natural number multiple of the wavelength of the ultrasonic vibration of the fourth predetermined frequency.

* * * * *